(12) United States Patent
Do et al.

(10) Patent No.: US 6,531,774 B1
(45) Date of Patent: Mar. 11, 2003

(54) CHIP SCALE ELECTRICAL TEST FIXTURE WITH ISOLATION PLATE HAVING A RECESS

(75) Inventors: Nhon T. Do, Mountain View, CA (US); John Vu, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/563,497

(22) Filed: May 3, 2000

(51) Int. Cl.[7] .............................. H01L 23/34; G01R 1/04

(52) U.S. Cl. ...................... 257/727; 324/758; 324/765; 439/17

(58) Field of Search .................................. 257/678, 692, 257/727, 780; 438/14, 15, 17, 18, 10, 11; 324/754, 755, 758, 765

(56) References Cited

U.S. PATENT DOCUMENTS

| | | | | |
|---|---|---|---|---|
| 5,435,482 A | * | 7/1995 | Variot et al. | 228/106 |
| 5,929,649 A | * | 7/1999 | Cramer | 324/761 |
| 5,959,462 A | * | 9/1999 | Lum | 324/760 |
| 5,990,696 A | * | 11/1999 | Swart | 324/754 |
| 6,040,702 A | * | 3/2000 | Hembree et al. | 324/755 |
| 6,084,781 A | * | 7/2000 | Klein | 257/738 |
| 6,384,618 B1 | * | 5/2002 | Pursel et al. | 324/755 |

* cited by examiner

Primary Examiner—Kevin M. Picardat

(57) ABSTRACT

A test fixture with an isolation plate grounds all of the solder balls of a ball grid array (BGA) of a chip scale package, except for a selected subset of the solder balls, to perform electrical characterization of the package. The isolation plate includes a recess ground into the plate, and a hole in the recess that permits access to the selected subset of solder balls. The recess provides clearance for a fixed compliant probe to land on the solder balls to be tested through the hole, and a probe contact surface for a ground portion of the probe to securely land.

17 Claims, 4 Drawing Sheets

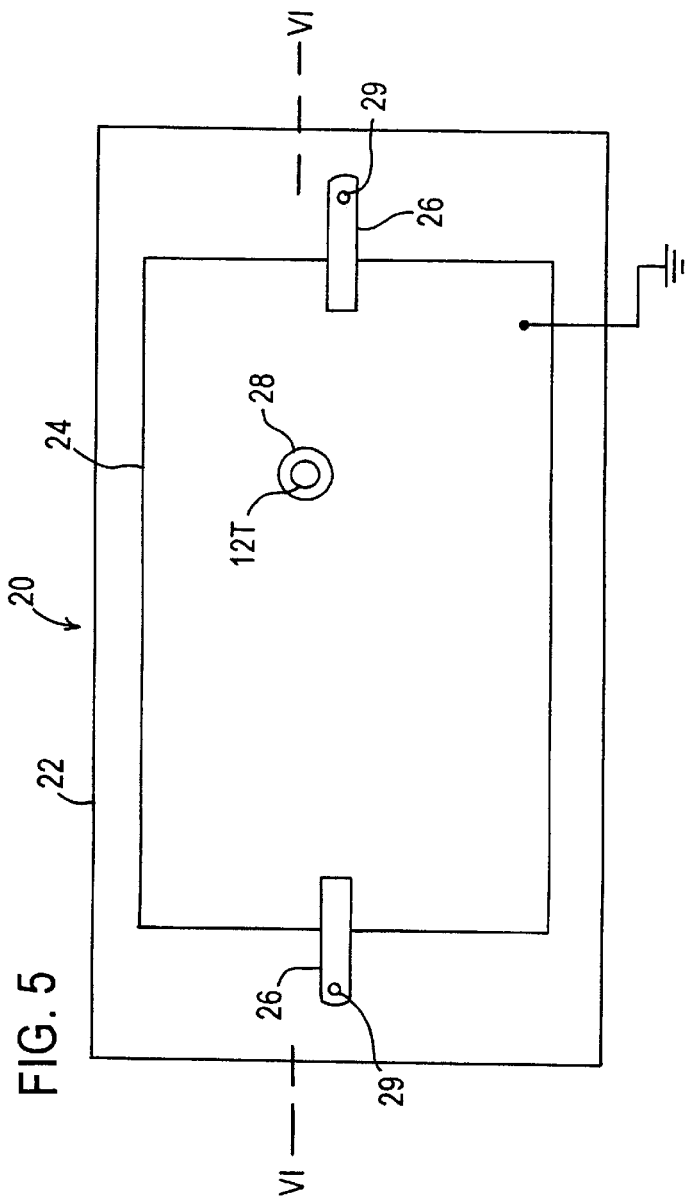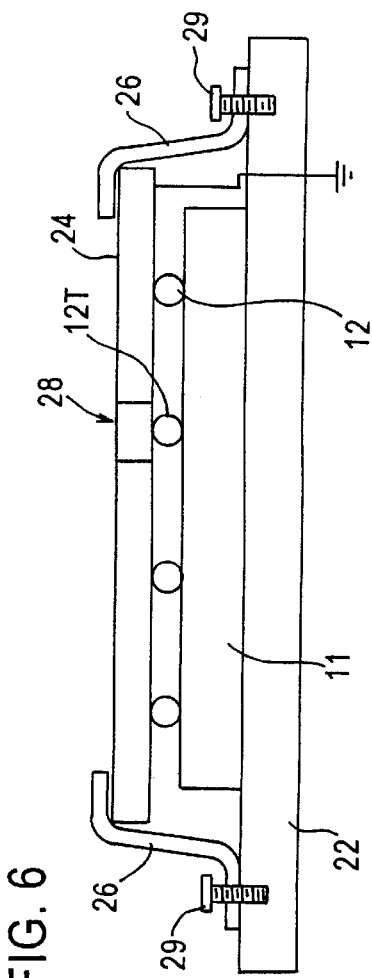
FIG. 5
FIG. 6

CHIP SCALE ELECTRICAL TEST FIXTURE WITH ISOLATION PLATE HAVING A RECESS

RELATED APPLICATIONS

This application contains similar subject matter to that disclosed in commonly assigned U.S. patent application Ser. No. 09/563,489, filed on May 3, 2000, now U.S. Pat. No. 6,424,140 for a CHIP SCALE ELECTRICAL TEST FIXTURE and U.S. patent application Ser. No. 09/525,475, filed on Mar. 15, 2000, now U.S. Pat. No. 6,384,618, for a CHIP SCALE ELECTRICAL TEST FIXTURE WITH ISOLATION PLATE HAVING AN ANGLED TEST HOLE.

FIELD OF THE INVENTION

The present invention relates to the testing of integrated circuits, and in particular, to the electrical characterization of a chip scale package.

DESCRIPTION OF RELATED ART

Electrical components utilizing integrated circuit chips are used in a number of applications. Controlled Collapsed Chip Connection is an interconnect technology developed as an alternative to wire bonding. This technology is generally known as C4 technology, or flip chip packaging. Broadly stated, one or more integrated circuit chips are mounted above a single or multiple layer substrate and pads on the chip are electrically connected to corresponding pads on a substrate by a plurality of electrical connections, such as solder bumps. The integrated circuit chips may be assembled in an array such as a 10×10 array. A substrate is then electrically connected to another electronic device such as a circuit board with the total package being used in an electronic device such as a computer.

It is desirable to perform an electrical characterization of an integrated circuit by measuring inductance (L), capacitance (C), and resistance (R) at electrical contacts of the integrated circuit. This has presented a problem, however, when measuring these parameters for a "chip scale package." Semiconductor dice, or chips, are typically individually packaged for use in plastic or ceramic packages. This is sometimes referred to as the first level of packaging. The package is required to support, protect, and dissipate heat from the die and to provide a lead system for power and signal distribution to the die. The package is also useful for performing burn-in and functionality testing of the die.

One type of semiconductor package is referred to as a "chip scale package." Chip scale packages are also referred to as "chip size packages," and the dice are referred to as being, "minimally packaged." Chip scale packages can be fabricated in "uncased" or "cased" configurations. Uncased chip scale packages have a footprint that is about the same as an unpackaged die. Cased chip scale packages have a peripheral outline that is slightly larger than an unpackaged die. For example, a footprint for a typical cased chip scale package can be about 1.2 times the size of the die contained within the package.

Typically, a chip scale package includes a substrate bonded to the face of the die. The substrate includes the external contacts for making outside electrical connections to the chip scale package. The substrate for a chip scale package can comprise flexible material, such as a polymer tape, or a rigid material, such as silicon, ceramic, or glass. The external contacts for one type of chip scale package includes solder balls arranged in a dense array, such as a ball grid array "BGA," or a fine ball grid array "FBGA." These dense arrays permit a high input/output capability for the chip scale package. For example, a FBGA on a chip scale package can include several hundred solder balls.

In order to test the electrical characteristics of the integrated circuit, test probes are used to contact individual solder balls. Performing precise measurements of the electrical characteristics on a chip scale package is very difficult, however, due to the dimensions. It is hard to isolate a single solder ball or other electrical contact, while grounding the remainder of the solder balls. Hence, isolation and testing of a single, selected solder ball of an integrated circuit has proven to be a difficult task.

SUMMARY OF THE INVENTION

There is a need for a test fixture that is able to isolate a single electrical contact (e.g., solder ball) on a chip scale package, while grounding all of the remaining solder balls on the chip scale package. Such a test fixture permits proper isolation of the solder ball under test for determining electrical characteristics at the solder ball.

These and other needs are met by embodiments of the present invention which provide a test fixture for holding, for electrical characteristic testing, an integrated circuit chip having a plurality of electrical contacts. The test fixture comprises a base, an isolation plate, and a holding device configured to hold the isolation plate against the base with an integrated circuit under test between the base and the isolation plate. The isolation plate is a flat plate configured to contact and ground all of the plurality of electrical contacts of the integrated circuit under test except for a selected subset of the electrical contacts. The isolation plate includes at least one hole through the isolation plate that exposes the selected subset of the electrical contacts, and a recess in the isolation plate surrounding each hole, each recess having a probe contact surface.

One of the advantages of the present invention is the clearance and level contact surface provided by the recess and its probe contact surface for a test probe. The recess can be readily provided in an isolation plate, by a grinding of the plate, for example, in the area surrounding a hole. This configuration allows a fixed compliant probe, such as those manufactured by Cascade Microwave, Inc., of Beaverton Oregon, to securely land not only on the contact within the hole, but also on the grounded probe contact surface of the isolation plate recess. This produces more reliable testing of a chip scale package.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 5 is a top view of the test fixture of FIG. 3 with a chip scale package under test inserted within the test fixture according to the method of the present invention.

FIG. 6 is a cross-section of the test fixture of FIG. 5 with the inserted chip scale package under test, taken along line VI—VI.

DETAILED DESCRIPTION OF THE INVENTION

The present invention addresses and solves problems related to the isolation of one or more solder balls in a chip scale package for electrical characteristic testing and provides an arrangement that allows more reliable testing of a chip scale package. This is achieved, in part, by a test fixture that has a conductive isolation plate configured to contact all of the electrical contacts (e.g., solder balls) on the chip scale package, except for a selected subset of contacts at which testing occurs. To provide access to the contacts for testing, one or more recesses are provided in the isolation plate, each recess having a hole that extends through the isolation plate. The holes are centered over the contacts when the conductive isolation plate is placed over the chip scale package. The holes allow access for a test probe to land on the contact of interest, while the recess provides clearance and allows a ground contact of the test probe to securely land on a grounded surface of the isolation plate.

Prior to discussing an embodiment of the present invention in which recesses with holes are provided in an isolation plate, an exemplary test fixture that may be used for electrical characterization of a chip scale package will be described. However, the present invention may be used with other test fixtures and testing procedures in which a plurality of electrical contacts are to be simultaneously grounded and probe access to the electrical contact and a secure grounding surface for the probe are desirable.

Figure 1:
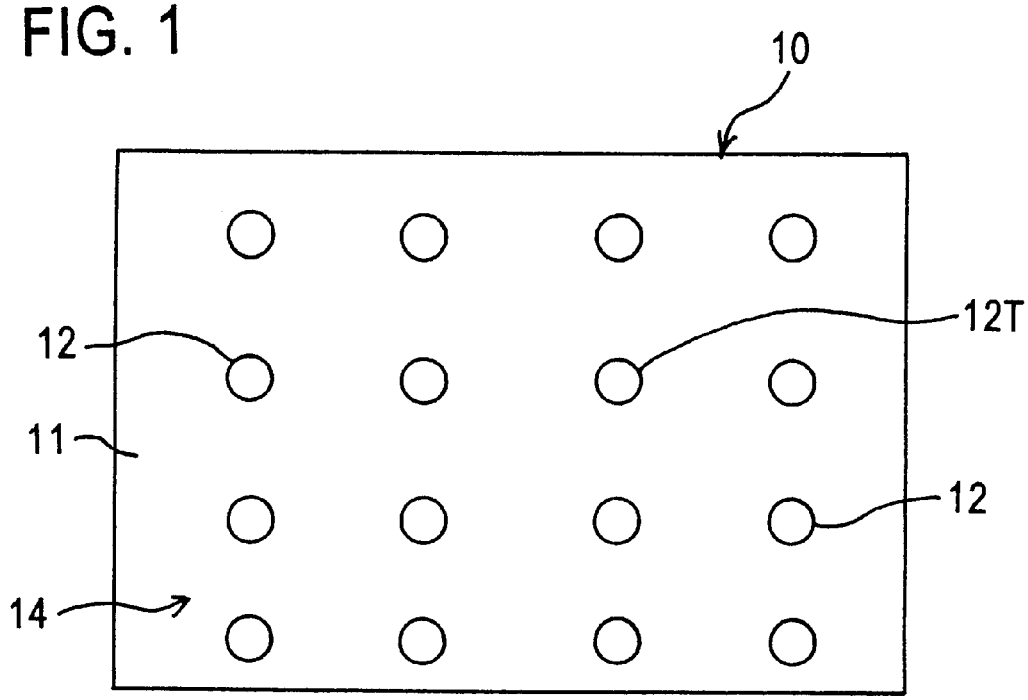
FIG. 1 is an enlarged, schematic top view of an exemplary chip scale package.

An exemplary embodiment of the chip scale package 10 is depicted in top view in FIG. 1. The chip scale package 10 includes a substrate 11, containing the integrated circuitry and/or interconnections. The circuitry is connected to a plurality of electrical contacts 12 formed on one side of the chip scale package 10. In preferred embodiments of the invention, the electrical contacts are formed by substrate balls 12 and are arranged in array 14. Thus, the solder balls form a ball grid array 14. Although depicted for illustration purposes in FIG. 1 as being relatively spread apart, in practice, the substrate balls 12 are very tightly packed on a chip scale package 10 in the ball grid array 14. Thus, it is difficult to isolate one of the solder balls 12 for electrical characteristic testing.

Figure 2:
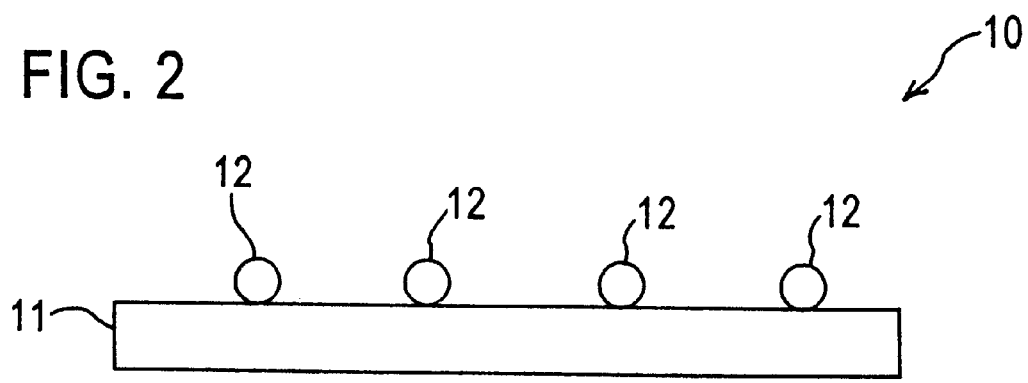
FIG. 2 is a side view of the chip scale package of FIG. 1.

A side view of the chip scale package 10 is provided in FIG. 2. As can be seen from this figure, the electrical contacts or balls extend from only one side of the chip scale package 10. One or more of these solder balls 12 will be a solder ball at which testing is desired. This solder ball to be tested is designated in FIGS. 1 and 2 as 12T. With the remaining balls it is often desirable to ground the remaining balls 12 on the chip scale package 10, at the same time isolating the ball 12T under test.

Figure 3:
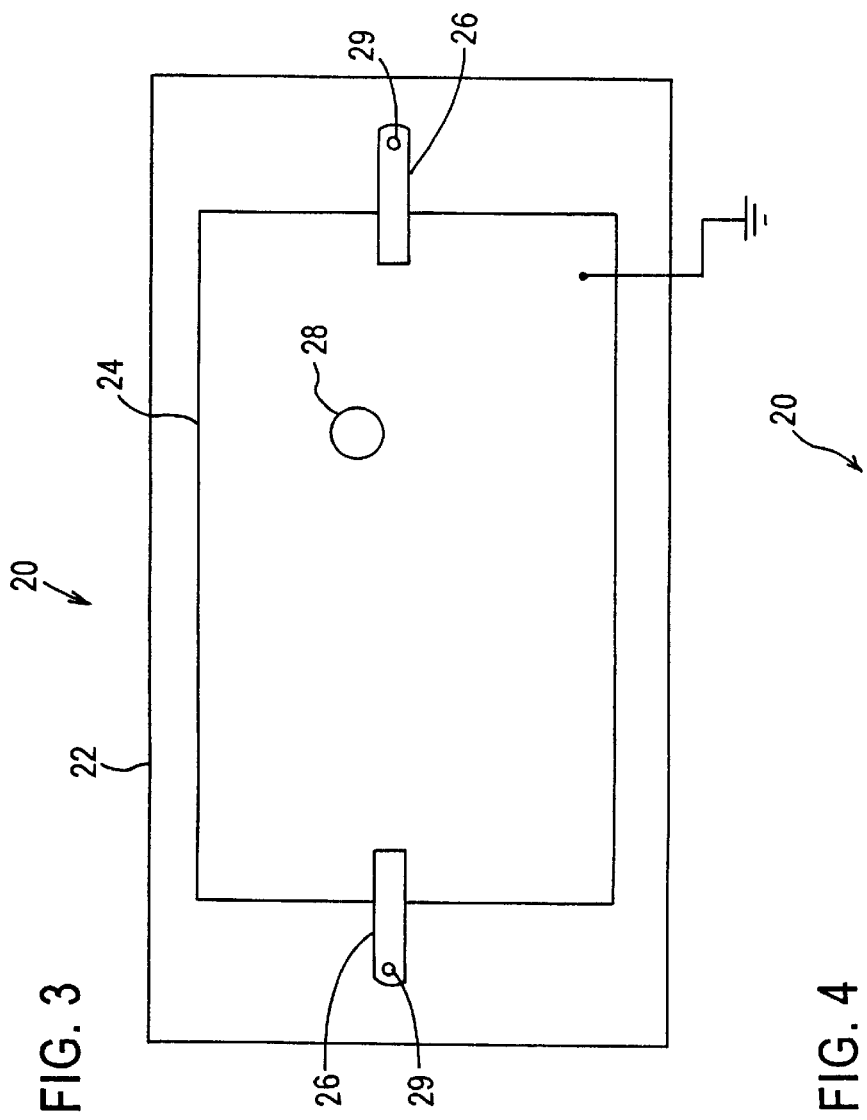
FIG. 3 is a top view of a test fixture constructed in accordance with embodiments of the present invention.

FIG. 3 is a top view of a test fixture constructed in accordance with embodiments of the present invention. This test fixture is elegant in construction and relatively inexpensive to create. At the same time, however, it provides a thorough grounding of all of the electrical contacts of the chip scale package 10, allowing an isolated subset of the electrical contacts to be tested for electrical characterization.

The test fixture 20 of FIG. 3 includes a base 22 made of either conductive or non-conductive material. For example, the base 22 may be made of a metal or may be made of a ceramic or carbon-fiber composite, or any other suitable material. The base 22 is generally planar in shape with a smooth surface so as not to damage a chip scale package placed on the surface of the base 22.

A conductive isolation plate 24, which serves as a grounding plate, is placed over the base 22. Generally, the isolation plate 24 is smaller in area than the base 22 and is substantially planar. The isolation plate 24 is a conductive plate, and is therefore made of a highly conductive material, such as a conductive metal. The isolation plate 24 is coupled to ground.

The isolation plate 24 is held against the base 22 by a pair of clamps 26 in the illustrated embodiment of FIG. 3. Other holding devices, such as elastomeric hold-down devices, replace the clamps 26 in other embodiments of the invention. The clamping, pressure applied against the isolation plate 24 is adjusted by an adjustment device 29, such as a screw. The adjustment device 29, e.g., a screw, is attached to the base 22.

The isolation plate 24 has a test hole 28 provided at a desired location on the surface of the isolation plate 24. Test hole 28 extends through the isolation plate 24 and is dimensioned so that it is slightly larger than the electrical contact or solder ball 12 of a chip scale package 10. The embodiment of FIG. 3 depicts a single test hole 28, but a plurality of test holes may be provided in isolation plate 24. This would provide access to a plurality of selected balls 12T for testing the electrical characteristics of the chip scale package 10 at these balls 12T. In the embodiment of FIG. 3, however, only a single test hole 28 is depicted.

Figure 4:
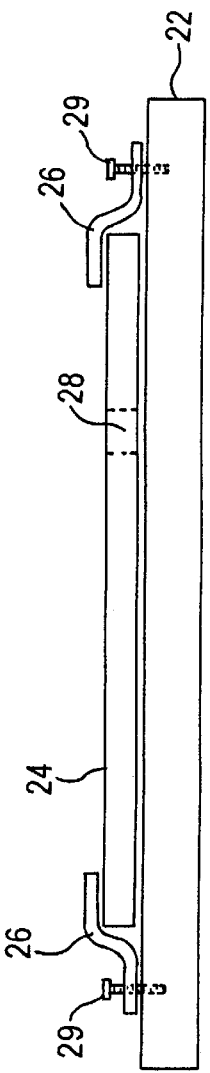
FIG. 4 is a side view of the test fixture of FIG. 3.

FIG. 4 is a side view of the test fixture 20 of FIG. 3. The chip scale package 10 is inserted between the isolation plate 24 and the base 22. The clamps 26 may be removed and the isolation plate 24 completely removed from the test fixture 20 prior to the positioning of the chip scale package 10 to be tested. The isolation plate 24 is then placed carefully onto the chip scale package 10 and the clamps 26 tightened through the adjustment device 29.

FIG. 5 depicts the test fixture 20 of FIG. 3, but with a chip scale package 10 inserted in the test fixture 20. The chip scale package 10 is properly positioned on the base 22 and the isolation plate 24 is properly positioned on a chip scale package 10 such that the desired solder balls 12T to be tested fall completely within the test hole 28. If more than one solder ball is to be tested, additional test holes 28 are provided in the isolation plate 24. The clamping pressure applied by the adjustment devices 29, as depicted in FIG. 6, is enough to ensure proper contact of the isolation plate 24 against each of the solder balls 12, but not enough to damage the solder balls 12. With proper contact of the solder balls 12 that are not under test to the isolation plate 24, and the grounding of this isolation plate 24, the solder balls 12 that are not under test are all properly grounded.

The subset of electrical contacts or solder balls 12T that are under test are exposed through the test hole or holes 28 in the isolation plate 24. The dimensioning of the test hole 28 in the isolation plate 24 is slightly larger than the solder ball under test 12. This ensures that the solder ball under test 12T does not contact the conductive isolation plate 24. The test hole 28 needs to be large enough, however, to allow a test probe (not shown) to access the solder ball under test 12T without contacting the isolation plate 24. When the test probe is able to establish contact with the ball under test 12T, the electrical characteristics, such as inductance, capacitance, and resistance at the ball under test 12T, which has been effectively isolated from the other balls 12 on the chip scale package 10, may be ascertained.

Figure 7:
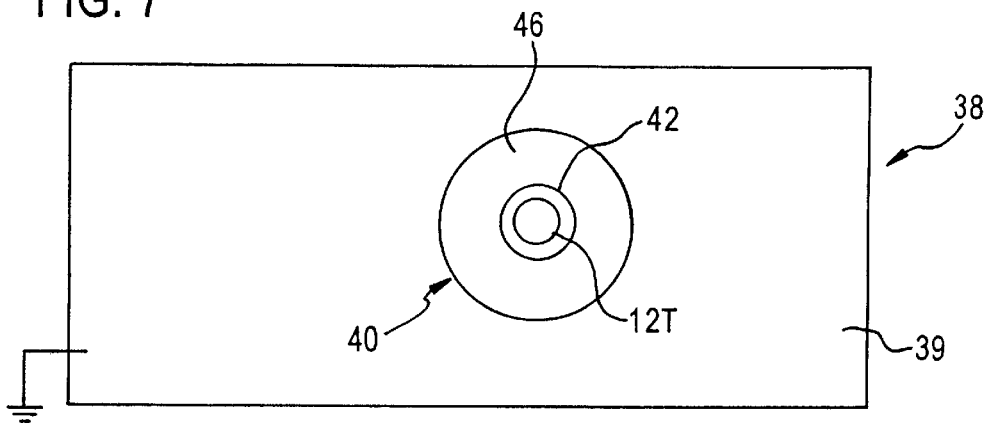
FIG. 7 is a top view of an isolation plate for use with a test fixture, such as the exemplary test fixture of FIG. 3, according to an embodiment of the present invention.
Figure 8:
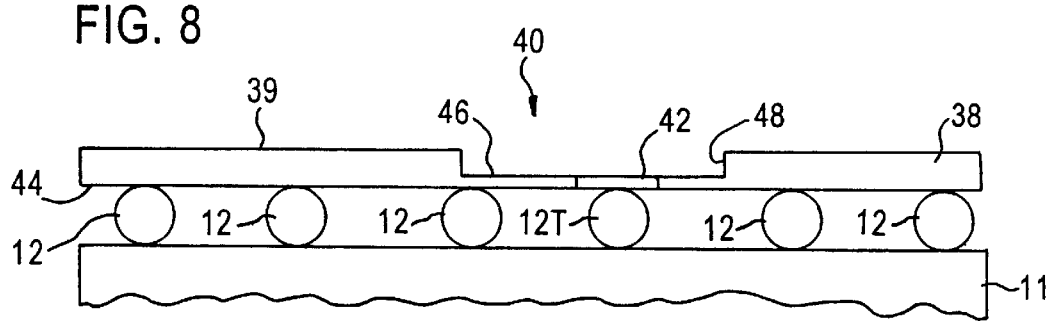
FIG. 8 is a side view of the isolation plate of FIG. 7.
Figure 9:
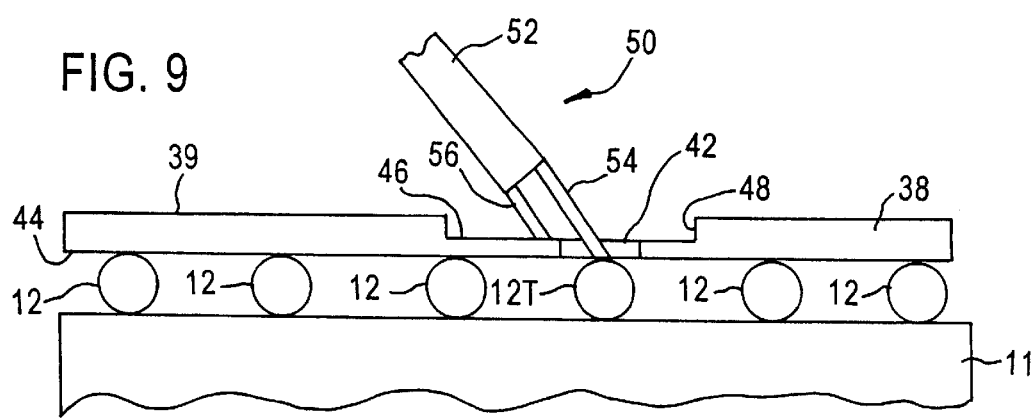
FIG. 9 is a side view of the isolation plate of FIG. 7, with a fixed compliant probe applied to a contact and the isolation plate.

Although the isolation plate 24 of FIGS. 3–6 is adequate to ground the electrical contacts 12 and isolate a solder ball 12T that is to be tested, a further improvement in the isolation plate that provides greater clearance for a test probe to assure landing of the probe on the solder ball 12T and on a grounded surface is desirable. To that end, FIGS. 7–9 depict another embodiment of an isolation plate 38 that may be used in the test fixture 20 of FIG. 3, replacing the isolation plate 24. It will be appreciated that the isolation plate 38 of FIGS. 7–9 may be used in conjunction with other test fixtures, as the description that follows is exemplary and not restrictive.

FIG. 7 is a top view of an isolation plate 38 constructed in accordance with embodiments of the present invention. The isolation plate 38 has a recess 40, as best seen in the side view of FIG. 8. The recess 40 may be formed by grinding of the isolation plate 38, from the top surface 50 of the isolation plate. This grinding leaves a recess 40 with a probe contact surface 46 and a sidewall 48. In FIG. 7, the recess 40 is depicted as circular, but other recess shapes are provided in other embodiments. Also, other methods of forming the recess 40 are acceptable, such as etching.

The recess 40 shares a common bottom surface 44 with the remaining portions of the isolation plate 38, as shown in FIG. 8. The thickness of the isolation plate 38 in the recess 40 is less than its thickness in the remaining portions of the isolation plate 38.

A hole 42, similar to the hole 28 in FIGS. 3–6, is provided in the recess 40. The probe contact surface 46 surrounds the hole 42. The probe contact surface 46, the sidewall 48 and the top surface 39 of the isolation plate 38 form a step in the exemplary embodiment.

When the isolation plate 38 is positioned in a test fixture, such as test fixture 20 of FIGS. 3–6, with a package to be tested inserted between the isolation plate 38 and the base 22, the bottom surface 44 of the isolation plate 38 contact all of the solder balls 12 that are to be grounded. Those solder balls 12T that are to be tested (i.e., the subset of balls in the grid array to be tested) do not contact the isolation plate 38. Instead, the solder balls 12T to be tested are located under the hole 42 within the recess 40. The solder balls 12T that are to be tested therefore are not grounded by the isolation plate 38.

The recess 40 provides greater space and more clearance for landing a microwave probe properly. An exemplary probe 50 is depicted in FIG. 9. The exemplary probe 50 has a cable 52 with an inner conductor and an outer conductor. The inner conductor is connected to the signal portion 54 of the probe 50, and the ground portion 56 in connected to the outer conductor. The signal portion 54, due to the wide recess 54, is able to easily land at large angles on the solder ball 12T under test, despite the presence of the isolation plate 38 over the ball. At the same time, the probe contact surface 46 provides a large area for the ground portion 56 to land. The measurements of the electrical characteristics of the chip scale package can be taken once the probe has landed on the solder ball 12T and the probe contact surface 46.

The configuration of an isolation plate in accordance with the present invention , including a recess that surrounds a hole dimensioned to expose an electrical contact to be tested, provides more space and clearance for a probe to land on the electrical contact to be tested and simultaneously land on a grounded surface. This increases the speed and reliability of the electrical characterization process for chip scale packages.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A test fixture for holding, for electrical characteristic testing, an integrated circuit chip having a plurality of electrical contacts, the test fixture comprising:

a base;

an isolation plate; and a holding device configured to hold the isolation plate against the base with an integrated circuit under test between the base and the isolation plate;

wherein the isolation plate is a flat plate configured to contact and ground all of the plurality of electrical contacts of the integrated circuit under test except for a selected subset of the electrical contacts, the isolation plate including at least one hole through the isolation plate that exposes the selected subset of the electrical contacts, and a recess in the isolation plate surrounding each hole, each recess having a probe contact surface.

2. The test fixture of claim 1, wherein the base is planar.

3. The test fixture of claim 2, wherein each hole in the isolation plate exposes only a single one of the electrical contacts.

4. The test fixture of claim 3, wherein each hole is dimensioned to be slightly larger than each exposed electrical contact.

5. The test fixture of claim 4, wherein the selected subset of the electrical contacts consists of a single electrical contact.

6. The test fixture of claim 5, wherein the electrical contacts are balls.

7. The test fixture of claim 1, wherein the isolation plate is a grounded metal plate.

8. The test fixture of claim 1, wherein the holding device includes a clamp attached to the base at one end of the clamp, with a free end contacting the isolation plate.

9. The test fixture of claim 8, further comprising an adjustment mechanism for adjusting the clamping force of the clamp against the isolation plate to thereby adjust the pressure exerted by the isolation plate against an integrated circuit under test between the isolation plate and the base.

10. The test fixture of claim 9, wherein the adjustment mechanism is a screw.

11. The test fixture of claim 1, wherein the isolation plate has a planar isolation plate top surface, a planar bottom, and the thickness of the isolation plate in the recess is less than the thickness of the remainder of the isolation plate.

12. The test fixture of claim 11, wherein the planar bottom of the isolation plate forms a common bottom surface of the recess and the isolation plate.

13. The test fixture of claim 12, wherein the recess includes a side wall that extends upwardly from the probe contact surface and surrounds the recess.

14. The test fixture of claim 13, wherein the probe contact surface, the side wall and the isolation plate top surface form a step.

15. The test fixture of claim 1, wherein the recess and the hole are adapted to respectively receive a ground contact and a signal contact of a probe.

16. The test fixture of claim 15, wherein the hole is dimensioned to accommodate a signal contact of a probe entirely within the hole without contacting the isolation plate.

17. The test fixture of claim 16, wherein the recess is dimensioned and the hole is positioned within the recess such that a ground contact of a probe lands on the recess when a signal contact of the probe lands on one of the electrical contacts exposed by the hole.

* * * * *